United States Patent [19]
Ohta et al.

[11] Patent Number: 5,393,370
[45] Date of Patent: Feb. 28, 1995

[54] METHOD OF MAKING A SOI FILM HAVING A MORE UNIFORM THICKNESS IN A SOI SUBSTRATE

[75] Inventors: Yutaka Ohta, Annaka; Masatake Katayama, Takasaki; Isao Moroga, Annaka, all of Japan

[73] Assignee: Shin-Etsu Handotai Kabushiki Kaisha, Tokyo, Japan

[21] Appl. No.: 139,849

[22] Filed: Oct. 22, 1993

[30] Foreign Application Priority Data

Oct. 23, 1992 [JP] Japan .................................. 4-285784

[51] Int. Cl.⁶ .................. B44C 1/22; C03C 15/00; C03C 25/06
[52] U.S. Cl. .................. 156/626; 156/643; 156/657; 156/345; 437/238
[58] Field of Search ................ 156/626, 627, 643, 657, 156/662, 345; 437/8, 225, 228, 238; 204/192.33

[56] References Cited

U.S. PATENT DOCUMENTS 5,213,657  5/1993  Abe et al. ........................ 156/631
5,223,080  6/1993  Ohta et al. ....................... 156/626

Primary Examiner—William Powell
Attorney, Agent, or Firm—Ronald R. Snider

[57] ABSTRACT

To provide a method of making a SOI film having a more uniform thickness in a SOI substrate which makes it possible to keep the variance at ±0.3 micrometers or less throughout the entire surface of the substrate, even for SOI substrates with a SOI film thickness between 1 micrometer and 10 micrometers. The surface of a SOI substrate is divided into a plurality of sections, then the SOI film thickness is measured for each section $W_i$ ($i = 1 - n$) by means of the spectral interference method using an optical fiber cable, and, simultaneously, the SOI film is etched down to a prescribed thickness by a dry etching device, and thus a desired value and a variance (±0.3 micrometers) of the SOI film thickness is obtained.

9 Claims, 3 Drawing Sheets

METHOD OF MAKING A SOI FILM HAVING A MORE UNIFORM THICKNESS IN A SOI SUBSTRATE

BACKGROUND OF THE INVENTION

1. Field of the Invention

This invention relates to a method making a SOI film having a more uniform thickness across the entire surface of a SOI substrate.

2. The Prior Art

Conventionally, as a method of forming a single crystal semiconductor thin film with a thickness of 1 micrometer or more on a dielectric substrate, the technique which comprises epitaxial growth of a single crystal silicon film and such on a single crystal saphire substrate has been well known. However, in this technique, because of the difference in the lattice constant between the dielectric substrate and the silicon single crystal which grows in the gas phase, many crystal defects occur in the silicon gas phase growth layer, rendering the practicality of said technique poor.

Because of this, joined wafers with a SOI (Si On Insulator) structure (hereafter referred to as SOI substrates) have been receiving attention lately. A SOI substrate is obtained by, for example: oxidizing at least one of two semiconductor substrates to form an oxide film on at least one of the two semiconductor substrates, stacking these two semiconductor substrates in such a way that said oxide film becomes the intermediate layer, bonding these by heating them up to a prescribed temperature, conducting surface grinding on one of the semiconductor substrates and further polishing it to make it a thin film, and thus obtaining a single crystal silicon thin film (hereafter referred to as a SOI film).

BRIEF SUMMARY OF THE INVENTION

It is desirable that, even for relatively thick SOI films with a thickness of 5 micrometers or more, the variance of the thickness be as small as possible (specifically, ±0.3 micrometers or less).

However, there is a limit to the degree of uniformity of the SOI film thickness under the current polishing control method, and it has been difficult to uniformalize the thickness so that the variance of the SOI film thickness is ±0.3 micrometers or less.

This invention was carried out with the problem described above in mind, and its objective is to provide a method of making a SOI film having a more uniform thickness in a SOI substrate which can keep the variance of the SOI film thickness at ±0.3 micrometers or less across the entire surface of the SOI substrate even for SOI substrates with a SOI film thickness between 1 micrometer and 10 micrometers.

In order to achieve the objective described above, this invention is characterized by partitioning the SOI substrate into a plurality of imaginary or phantom sections, measuring the SOI film thickness of each section by means of the visual light spectral interference method using an optical fiber cable, and simultaneously etching the SOI film to a prescribed thickness with a dry etching device.

In this invention, a process of measuring the SOI film thickness of each section of the SOI substrate and simultaneously conducting the etching treatment is continuously carried out for all the sections, and therefore the SOI film made more uniform thickness is uniformalized and the variance is kept at ±0.3 micrometers or less.

Also, this invention makes it possible to save the time of independently measuring the SOI film thickness, so that the treatment time per SOI substrate can be shortened.

DETAILED DESCRIPTION OF THE INVENTION

Figure 1:
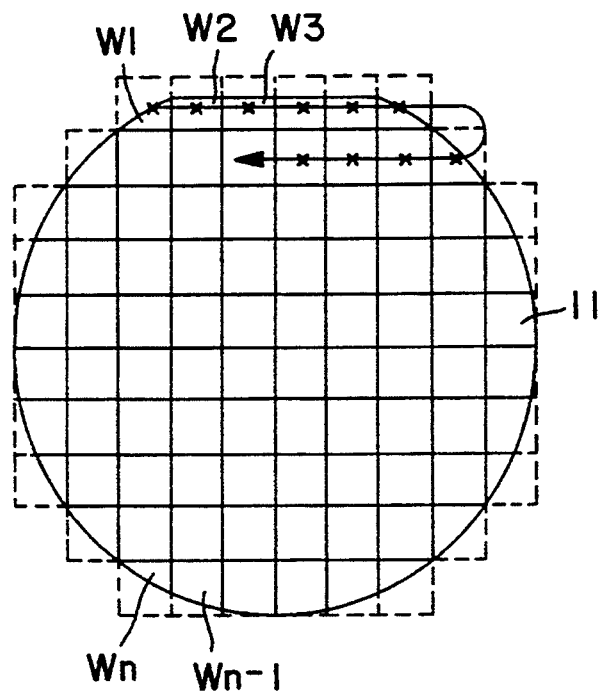
FIG. 1 shows a top view of a SOI substrate to which Example 1 and Example 4 of this invention are applied.
Figure 2:
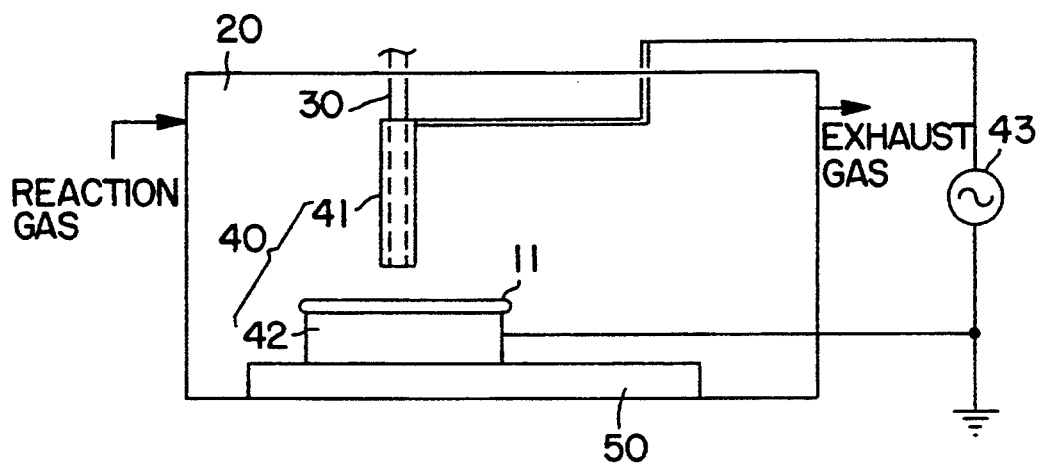
FIG. 2 shows a schematic view of a device for implementing Example 1 and Example 3 of this invention.

In this Example 1, as shown in FIG. 1, a SOI substrate 11 is divided into sections W1, W2 ... Wn, then said SOI substrate is placed in a reaction chamber 20, as shown in FIG. 2, and the SOI film thickness is measured for each of the sections W1, W2 ... Wn by means of the visual light spectral interference method using the optical fiber cable 30 while the etching treatment by a dry etching device 40 is carried out simultaneously.

The dry etching device described above is a device which can etch only a square area of $8 \times 8$ to $14 \times 14$ $mm^2$. This device comprises an upper electrode 41 with a square pole shape, a lower electrode 42 with a disc shape, and a high frequency power supply 43 connected to both electrodes 41 and 42. The lower electrode 42 is secured on an X-Y table 50 which can move within the X-Y plane (horizontal plane). Said optical fiber cable 30 is embedded and secured in the upper electrode 41, and the opening of said optical fiber cable 30 is on the lower surface of the upper electrode 41 and facing toward the upper surface of the SOI substrate 11.

As shown in FIG. 2, the SOI substrate 11 is secured on the lower electrode 42 in the reaction chamber 20, and the reaction gas ($SF_6/O_2$ gas) is fed into the reaction chamber 20.

The X-Y table 50 is then driven in such a way that the upper electrode 41 of the dry etching device 40 and the optical fiber cable 30 embedded in said upper electrode 41 intermittently move through the sections on the SOI substrate 11 in the order of W1, W2 ... Wn. On each of the sections W1, W2 ... Wn, the SOI film thickness is measured by means of the visual light spectral interference method using the optical fiber cable 30, and the etching treatment by the dry etching device 40 is carried out simultaneously, so that the SOI film thickness can be checked while the etching treatment continues until the SOI film thickness reaches a desired value. The dry etching device 40 used here is a etching device which utilizes high frequency plasma.

Once the treatment described above (etching treatment along with the SOI film thickness measurement) is completed on a section (W1, for example), the same treatment is given to the next section (W2). When these treatments have been given to all the sections W1–Wn, the SOI film thickness has the desired value with the desired variance (±0.3 micrometers or less), and thus the film thickness is make more uniform throughout the entire surface of the SOI substrate 11, compared with the conventional technique already mentioned.

As described above, in this invention, the SOI film thickness of each of the sections W1, W2 ... Wn of the SOI substrate 11 is measured and the SOI film is etched until the thickness reaches the desired value, thus not only the SOI film thickness is made more uniform as mentioned above, but the time to independently measure the SOI film thickness is eliminated, so that the treatment time per SOI substrate can be shortened for higher efficiency.

The method of Example 1 was applied to a 5" N-type <100> SOI substrate which has a center thickness of 9.3 micrometers when the desired value of the SOI film thickness was 8.0 micrometers.

First, the entire surface of the SOI substrate was divided into 12 mm square sections, and the visual light spectral interference method using a 3 mm diameter optical fiber cable embedded in the upper electrode was employed to etch the SOI film of each section to the desired thickness to obtain a thin film. During the etching treatment, short wavelength visual light and ultraviolet light were generated, and, in order to avoid the influence of these lights, the film thickness measurement was conducted using only filtered light with a wavelength of 500 nm or longer.

The $8 \times 8$ mm$^2$ upper electrode and the 200 mm diameter lower electrode were used for the etching treatment. The distance between them was set to be 8 mm, and the distance between the upper electrode and the SOI substrate was set to be 7 mm. While the reaction gas (SF$_6$/O$_2$ gas) was fed into the reaction chamber at a rate of 45/5 cc/min, a high frequency voltage with a 13.56 MHz frequency and a 0.25 W power was applied between both electrodes. An $12 \times 12$ mm$^2$ area with an approximately square shape on the SOI film was etched under the electrode. The depth-wise etching rate was 0.06 micrometers/min.

After the etching treatment, the resulting SOI film thickness distribution was 8.2±0.29 micrometers, indicating that the SOI film thickness was uniformalized with the variance of ±0.3 micrometers or less.

Example 2 of this invention is described below by referring to FIG. 3 and FIG. 4.

Whereas said Example 1 measures the SOI film thickness on a section Wi (the i-th section) and simultaneously etches that section Wi, the method of this example measures the SOI film thickness on a section Wi while the SOI film on the adjacent section Wi-1 (the section where the film thickness has already been measured) is given the etching treatment based on the film thickness measurement.

That is, in this example, the SOI substrate 11 is divided into a plurality of sections W1, W2 ... Wn as shown in FIG. 3, in the same manner as said Example 1. This SOI substrate 11 is then placed in a reaction chamber 20, as shown in FIG. 4. And, first, the SOI film thickness of section W1 is measured by means of the visual light spectral interference method using an optical fiber cable 30. Next, the SOI film thickness of section W2 is measured and, simultaneously, section W1, the SOI film thickness of which has already been measured, is given the etching treatment by the dry etching device 40.

The process continues in a similar manner, i.e. the SOI film thickness is measured on section Wi (the i-th section) and, simultaneously, the etching treatment is given to section Wi-1. However, the etching treatment is conducted by rows on the SOI substrate. Therefore, for example, as shown in FIG. 3, when etching is being conducted on section W5 which is located at the end of the first row, the film thickness is not measured for section W6 which is in the second row. After the etching treatment for section W5 is completed, a row change takes place and the film thickness measurement for section W6 in the second row is conducted. After that, the film thickness measurement for section W7 and the etching treatment for section W6 are simultaneously conducted.

The dry etching device described above is a device which can etch only a square area of $8 \times 8$ to $14 \times 14$ mm$^2$. This device comprises an upper electrode 41 with a square pole shape, a lower electrode 42 with a disc shape, and a high frequency power supply 43 connected to both electrodes 41 and 42. The lower electrode 42 is secured on an X-Y table 50 which can move within the X-Y plane (horizontal plane). Said optical fiber cable 30 is secured at the position away from the center line of the upper electrode 41 by the length of one section (see a section of the SOI substrate 11 (FIG. 3)), and the opening of said optical fiber cable 30 is at 3 mm above the SOI substrate 11 facing toward the upper surface of the SOI substrate 11.

Figure 4:
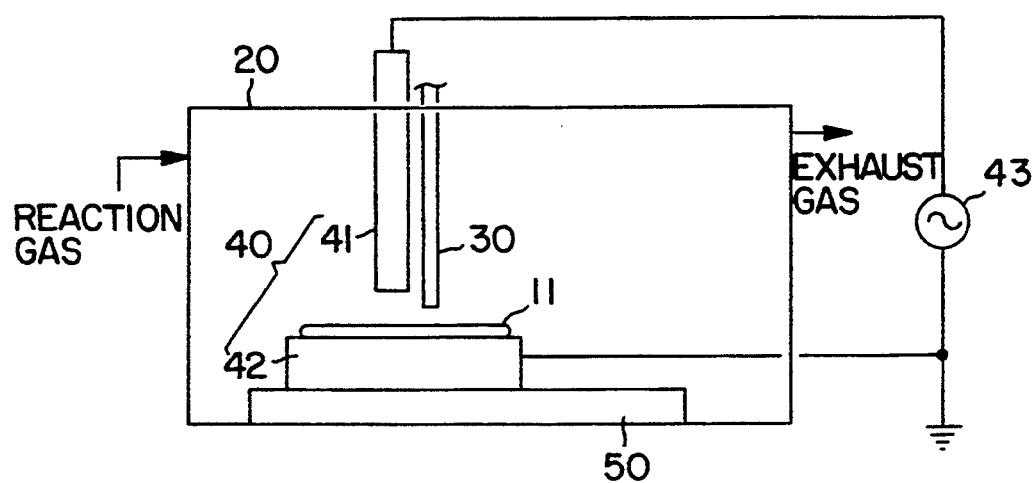
FIG. 4 shows a schematic view of a device for implementing Example 2 and Example 4 of this invention.

As shown in FIG. 4, the SOI substrate 11 is secured on the lower electrode 42 in the reaction chamber 20, and the reaction gas (SF$_6$/O$_2$ gas) is fed into the reaction chamber 20.

Then, the X-Y table 50 is driven in such a way that the upper electrode 41 of the dry etching device 40 and the optical fiber cable 30 intermittently move through the sections on the SOI substrate in the order of W1, W2 ... Wn. On each section Wi, the SOI film thickness is measured by means of the visual light spectral interference method using the optical fiber cable 30, and, simultaneously, the etching treatment by the dry etching device 40 is carried out on section Wi-1 which is adjacent to section Wi. When these treatments have been carried out on all the sections W1–Wn, the SOI film thickness becomes the desired value with the desired variance (±0.3 micrometers or less), and thus the film thickness is made more uniform throughout the entire surface of the SOI substrate 11.

As described above, in this invention, the SOI film thickness of each section Wi of the SOI substrate 11 is measured, and simultaneously the adjacent section Wi-1 is etched, thus not only the SOI film thickness is made more uniform as mentioned above, but the time to independently measure the SOI film thickness is eliminated, so that the treatment time per SOI substrate can be shortened for higher efficiency.

The method of this example was applied to a 5" N-type <100> SOI substrate which has a center thickness of 9.3 micrometers when the desired value of the SOI film thickness was 8.0 micrometers.

First, the entire surface of the SOI substrate was divided into 12 mm square sections, and the visual light spectral interference method using a 3 mm diameter optical fiber cable secured at the position 12 mm away from the center line of the upper electrode was employed to measure the SOI film of each section, while the SOI film on the adjacent section (the section where the film thickness has already been measured) is given the etching treatment to obtain a thin film. During the etching treatment, short wavelength visual light and ultraviolet light were generated, and in order to avoid the influence of this light, the film thickness measurement was conducted using only filtered light with a wavelength of 500 nm or longer.

The 8×8 mm² upper electrode and the 200 mm diameter lower electrode were used for the etching treatment. The distance between them was set to be 8 mm, and the distance between the upper electrode and the SOI substrate was set to be 7 mm. While the reaction gas ($SF_6/O_2$ gas) was fed into the reaction chamber at a rate of 45/5 cc/min, a high frequency voltage with a 13.56 MHz frequency and a 0.25 W power was applied between both electrodes. A 12×12 mm² area with an approximately square shape on the SOI film was etched under the electrode. The depth-wise etching rate was 0.06 micrometers/min.

After the etching treatment, the resulting SOI film thickness distribution was 8.1±0.25 micrometers, indicating that the SOI film thickness was uniformalized with the variance of ±0.3 micrometers or less.

Example 3 of this invention is described below by referring to the attached drawings.

Whereas said Example 1 and Example 2 measure the SOI film thickness of each section by intermittently moving the optical fiber cable between sections of the SOI substrate, the optical fiber and the dry etching device of this embodiment continuously scan the SOI substrate at a prescribed speed(s), and, in the process, the SOI film thickness is measured at prescribed time intervals and the dry etching device etches the section where the film thickness is currently being measured.

Figure 5:
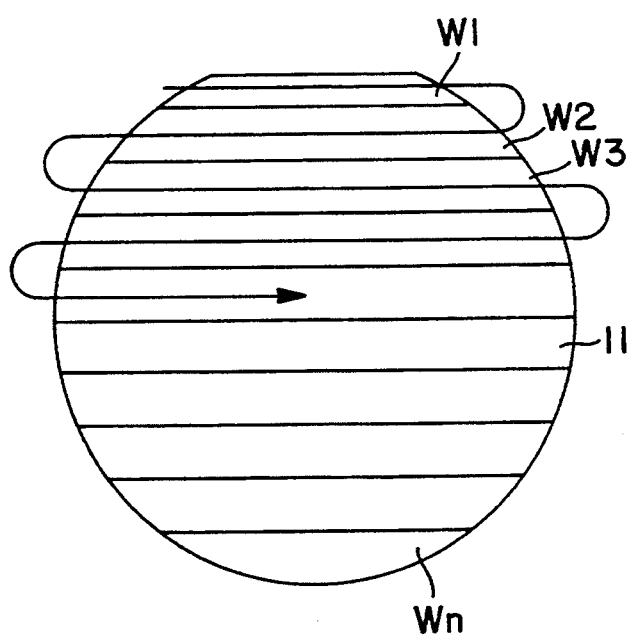
FIG. 5 shows a top view of a SOI substrate to which Example 3 of this invention are applied.

That is, in this example, as shown in FIG. 5, a SOI substrate 11 is divided into a plurality of sections W1, W2 ... Wn, then said SOI substrate 11 is placed in a reaction chamber 20, as shown in FIG. 2, and the SOI film thickness is measured for each of sections W1, W2 ... Wn at prescribed time intervals (timing) by means of the visual light spectral interference method using the optical fiber cable 30 while the etching treatment by a dry etching device 40 is carried out simultaneously on the area where the measurement is being conducted.

The dry etching device described above is a device which can etch only an 8–14 mm diameter area. This device comprises an upper electrode 41 with a cylindrical shape, a lower electrode 42 with a disc shape, and a high frequency power supply 43 connected to both electrodes 41 and 42. The lower electrode 42 is secured on an X-Y table 50 which can move within the X-Y plane (horizontal plane). Said optical fiber cable 30 is embedded and secured in the upper electrode 41, and the opening of said optical fiber cable 30 is on the lower surface of the upper electrode 41 and faces toward the upper surface of the SOI substrate 11.

As shown in FIG. 2, the SOI substrate 11 is secured on the lower electrode 42 in the reaction chamber 20, and the reaction gas ($SF_6/O_2$ gas) is fed into the reaction chamber 20. Then, the X-Y table 50 is driven in such a way that the upper electrode 41 of the dry etching device 40 and the optical fiber cable 30 embedded in said upper electrode 41 continuously scan the sections on the SOI substrate 11 in the order of W1, W2 ... Wn, and the SOI film thickness is measured for each of sections W1, W2 ... Wn at prescribed time intervals (timing) by means of the visual light spectral interference method using the optical fiber cable 30 while the etching treatment by a dry etching device 40 is carried out simultaneously on the area where the measurement is being conducted. The SOI film thickness measurement is conducted every 3–60 seconds, and the scanning speed is reviewed each time.

As described above, in this example, the SOI film thickness of the SOI substrate 11 is measured at prescribed time intervals while the etching treatment is carried out simultaneously on the area where the measurement is being conducted, thus not only the SOI film thickness is made more uniform as mentioned above, but the time to independently measure the SOI film thickness is eliminated, so that the treatment time per SOI substrate can be shortened for higher efficiency.

The method of this example was applied to a 5" N-type <100> SOI substrate which has a center thickness of 9.3 micrometers when the desired value of the SOI film thickness was 8.0 micrometers.

First, the entire surface of the SOI substrate was divided into 12 mm wide sections, and a 3 mm diameter optical fiber cable and an 8 mm diameter upper electrode continuously scanned the SOI substrate, while the SOI film thickness was measured with the visual light spectral interference method at a rate of once every 10 seconds, and simultaneously the area being measured was etched. During the etching treatment, short wavelength visual light and ultraviolet light were generated, and, in order to avoid the influence of this light, the film thickness measurement was conducted using only filtered light with a wavelength of 500 nm or longer.

Said 8 mm diameter upper electrode and the 200 mm diameter lower electrode were used for the etching treatment. The distance between them was set to be 8 mm, and the distance between the upper electrode and the SOI substrate was set to be 7 mm. While the reaction gas ($SF_6/O_2$ gas) was fed into the reaction chamber at a rate of 45/5 cc/min, a high frequency voltage with a 13.56 MHz frequency and a 0.25 W power was applied between both electrodes. The scanning speed V (mm/min) of the optical fiber cable and the dry etching device can be determined by the equation $V = 8 \times 0.06/(X - 8.0)$, where 8 is the diameter (mm) of the upper electrode, 0.06 is the etching rate (micrometer/min), and X and 8 are the actual film thickness (micrometers) and the target film thickness (micrometers), respectively.

After the etching treatment, the resulting SOI film thickness distribution was 8.1±0.25 micrometers, indicating that the SOI film thickness was made more uniform with the variance of ±0.3 micrometers or less.

Example 4 of this invention is described below.

In this example, the optical fiber cable and the dry etching device continuously scan the SOI substrate at a prescribed speed(s), and in the process, the SOI film thickness is measured at prescribed intervals, in the same manner as for said Example 3, however the dry etching device carries out the etching treatment for the section adjacent to the section of the SOI substrate where the film thickness is currently being measured, in the same manner as for Example 4.

Figure 3:
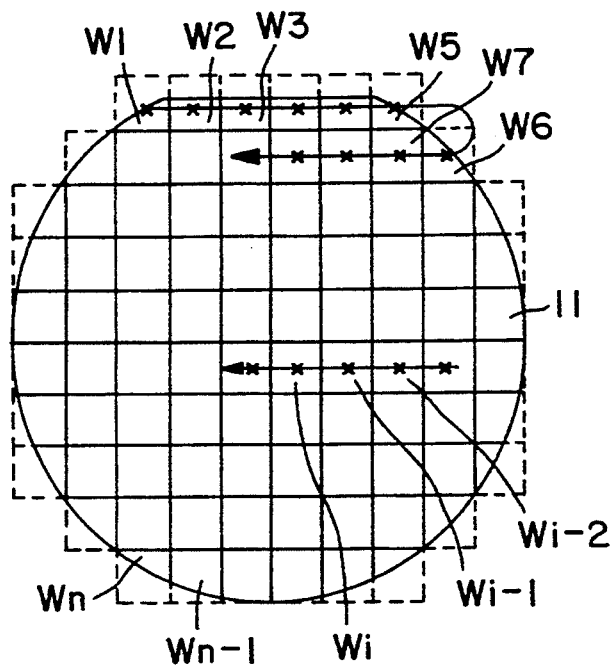
FIG. 3 shows a top view of a SOI substrate to which Example 2 of this invention is applied.

That is, in this example, as shown in FIG. 3, a SOI substrate 11 is divided into a plurality of sections W1, W2 ... Wn, in the same manner as for said Example 2. Then said SOI substrate is placed in a reaction chamber 20, as shown in FIG. 4, and the optical fiber cable 30 and the dry etching device 40 continuously scan the SOI substrate from section W1 toward Wn.

When the continuous scanning by the optical fiber cable 30 is conducted as described above, first the SOI film thickness is measured for section W1 by means of the visual light spectral interference method using the optical fiber cable 30. Then, the SOI film thickness is measured for section W2, and, simultaneously, section W1 for which the SOI film thickness has already been measured is etched by the dry etching device 40.

The process continues in a similar manner, i.e. the SOI film thickness is measured on section Wi (the i-th section) and, simultaneously, the etching treatment is given to section Wi-1. However, the etching treatment is conducted by rows on the SOI substrate. Therefore, for example, as shown in FIG. 3, when etching is being conducted on section W5 which is located at the end of the first row, the film thickness is not measured for section W6 which is in the second row. After the etching treatment for section W5 is completed, a row change takes place and the film thickness measurement for section W6 in the second row is conducted. After that, the film thickness measurement for section W7 and the etching treatment for section W6 are simultaneously conducted.

The dry etching device 40 described above is a device which can etch only an 8-14 mm diameter area. This device comprises an upper electrode 41 with a cylindrical shape, a lower electrode 42 with a disc shape, and a high frequency power supply 43 connected to both electrodes 41 and 42. The lower electrode 42 is secured on an X-Y table 50 which can move within the X-Y plane (horizontal plane). Said optical fiber cable 30 is secured at the position away from the center line of the upper electrode 41 by the length of one section (see a section of the SOI substrate 11 (FIG. 3)), and the opening of said optical fiber cable 30 is at 3 mm above the SOI substrate 11 and faces toward the upper surface of the SOI substrate 11.

As shown in FIG. 4, the SOI substrate 11 is secured on the lower electrode 42 in the reaction chamber 20, and the reaction gas ($SF_6/O_2$ gas) is fed into the reaction chamber 20.

Then, the X-Y table 50 is driven in such a way that the upper electrode 41 of the dry etching device 40 and the optical fiber cable 30 continuously scan the sections on the SOI substrate in the order of W1, W2 ... Wn. On each section Wi, the SOI film thickness is measured by means of the visual light spectral interference method using the optical fiber cable 30, and, simultaneously, the etching treatment by the dry etching device 40 is carried out on section Wi-1 which is adjacent to section Wi. When these treatments have been carried out to all the sections W1-Wn, the SOI film thickness is the desired value with the desired variance ($\pm 0.3$ micrometers or less), and thus the film thickness is uniformalized throughout the entire surface of the SOI substrate 11.

The scanning speed of the optical fiber cable 30 and the dry etching device 40 is determined by the following procedure:

1) When the optical fiber cable 30 reaches the center of section Wi on the SOI substrate 11, the film thickness is measured and the measurement is stored in a computer. Also, the scanning speed at the time when the upper electrode 41 of the dry etching device 40 will reach section Wi-1 is calculated. At this point, the upper electrode 41 is at section Wi-2 and etching the section.
2) When the edge of the upper electrode 41 enters section Wi-1, the scanning speed calculated in 1) is applied.
3) When the center of the upper electrode 41 reaches the center of section Wi-1, i.e. when the center of the optical fiber cable 30 reaches the center of the section Wi, the film thickness of section Wi is measured, and the scanning speed is calculated. Measurement of the film thickness, including calculation, is completed within 1 second.
4) When the edge of the upper electrode 41 enters section Wi, the scanning speed calculated in 3) is applied.

As described above, in this example, the SOI film thickness of each section Wi of the SOI substrate 11 is measured, and simultaneously the adjacent section Wi-1 is etched, thus not only the SOI film thickness is uniformalized as mentioned above, but the time to independently measure the SOI film thickness is eliminated, so that the treatment time per SOI substrate can be shortened for higher efficiency.

The method of this example was applied to a 5" N-type <100> SOI substrate which has a center thickness of 9.3 micrometers when the desired value of the SOI film thickness was 8.0 micrometers.

First, the entire surface of the SOI substrate was divided into 12 mm square sections, and the visual light spectral interference method using a 3 mm diameter optical fiber cable secured at the position 12 mm away from the center line of the upper electrode was employed to measure the SOI film of each section, while the SOI film on the adjacent section (the section where the film thickness has already been measured) is given the etching treatment to obtain a thin film. During the etching treatment, short wavelength visual light and ultraviolet light were generated, and, in order to avoid the influence of this light, the film thickness measurement was conducted using only filtered light with a wavelength of 500 nm or longer.

The 8 mm diameter upper electrode and the 200 mm diameter lower electrode were used for the etching treatment. The distance between them was set to be 8 mm, and the distance between the upper electrode and the SOI substrate was set to be 7 mm. While the reaction gas ($SF_6/O_2$ gas) was fed into the reaction chamber at a rate of 45/5 cc/min, a high frequency voltage with a 13.56 MHz frequency and a 0.2 W power was applied between both electrodes. The scanning speed V (mm/min) of the optical fiber cable and the dry etching device can be determined by the equation $V = 8 \times 0.06/(X - 8.0)$, where 8 is the diameter (mm) of the upper electrode, 0.06 is the etching rate (micrometers/min), X and 8 are the actual film thickness (micrometers) and the target film thickness (micrometers), respectively.

After the etching treatment, the resulting SOI film thickness distribution was $8.1 \pm 0.25$ micrometers, indicating that the SOI film thickness was uniformalized with the variance of $\pm 0.3$ micrometers or less.

As shown in the description thus far, in this invention, the SOI substrate is divided into a plurality of sections, and the SOI film thickness is measured for each section by means of the visual light spectral interference method using a optical fiber cable, and, simultaneously, the SOI film is etched down to a prescribed thickness by the dry etching device, and the effect of this invention is that it is possible to uniformalize the SOI film thickness and keep the variance at $\pm 0.3$ micrometers or less even for SOI substrates with a SOI film thickness between 1 micrometer and 10 micrometers.

What is claimed is:

1. A method of making a SOI film having a more uniform thickness in a SOI substrate characterized by partitioning the SOI substrate into a plurality of sections, measuring the SOI film thickness of each section by means of the visual light spectral interference method using an optical fiber cable, and simultaneously etching the SOI film to a desired thickness with a dry etching device.

2. A method of making a SOI film having a more uniform thickness in a SOI substrate as described in claim 1 wherein said optical fiber cable and the dry etching device move intermittently between the sections of the SOI substrate, and the dry etching device etches the section where the film thickness is currently being measured or a section adjacent to the section where the film thickness is currently being measured.

3. A method of making a SOI film having a more uniform thickness in a SOI substrate as described in claim 1 wherein said optical fiber cable and the dry etching device continuously scan the SOI substrate and, in the process, the SOI film thickness is measured at time intervals and the dry etching device etches the section where the film thickness is currently being measured or a section adjacent to the section where the film thickness is currently being measured.

4. A method of making a SOI film having a more uniform thickness in a SOI substrate as described in claim 3 wherein scanning speed of said optical fiber cable and the dry etching device is determined according to the etching depth on each section.

5. A method of making a SOI film having a more uniform thickness in a SOI substrate as described in claim 2 wherein: said dry etching device includes upper and lower electrodes placed above and below the SOI substrate and a high frequency power supply which applies a high frequency voltage on said electrodes; and said optical fiber is embedded in the upper electrode.

6. A method of making a SOI film having a more uniform thickness in a SOI substrate as described in claim 3 wherein: said dry etching device includes upper and lower electrodes placed above and below the SOI substrate and a high frequency power supply which applies a high frequency voltage on said electrodes; and said optical fiber is embedded in the upper electrode.

7. A method of making a SOI film having a more uniform thickness in a SOI substrate as described in claim 3 wherein scanning speed of said optical fiber cable and the dry etching device is determined according to the etching rate.

8. A method of making a SOI film having a more uniform thickness in a SOI substrate as described in claim 2 wherein: said dry etching device includes upper and lower electrodes placed above and below the SOI substrate and a high frequency power supply which applies a high frequency voltage on said electrodes; and said optical fiber is placed at a distance from the upper electrode.

9. A method of making a SOI film having a more uniform thickness in a SOI substrate as described in claim 3 wherein: said dry etching device includes upper and lower electrodes placed above and below the SOI substrate and a high frequency power supply which applies a high frequency voltage on said electrodes; and said optical fiber is placed at a distance from the upper electrode.

* * * * *